United States Patent
Lunceford

(12) 
(10) Patent No.: US 6,306,688 B1
(45) Date of Patent: Oct. 23, 2001

(54) METHOD OF REWORKABLY REMOVING A FLUORINATED POLYMER ENCAPSULANT

(75) Inventor: Brent D. Lunceford, Austin, TX (US)

(73) Assignee: Teravicta Technologies, Inc., Austin, TX (US)

( * ) Notice: Subject to any disclaimer, the term of this patent is extended or adjusted under 35 U.S.C. 154(b) by 0 days.

(21) Appl. No.: 09/351,750

(22) Filed: Jul. 8, 1999

Related U.S. Application Data

(60) Provisional application No. 60/131,617, filed on Apr. 28, 1999.

(51) Int. Cl.[7] ............................. H01L 21/44; H01L 21/48; H01L 21/50
(52) U.S. Cl. ............................. 438/127; 438/4; 438/15; 438/106; 438/112; 438/126; 29/402.03
(58) Field of Search ....................... 438/106, 112, 438/126, 127, 4, 15; 257/788; 134/2, 10; 29/402.03, 402.04, 402.09, 402.11; 264/36.22

(56) References Cited

U.S. PATENT DOCUMENTS

| | | | |
|---|---|---|---|
| 4,017,495 | * 4/1977 | Jaffe et al. ........................... 264/272 |
| 4,118,861 | 10/1978 | Palmisano ............................ 29/631 |
| 4,490,496 | 12/1984 | Maekawa et al. ..................... 524/317 |
| 4,729,062 | 3/1988 | Anderson et al. .................... 361/399 |
| 4,826,756 | * 5/1989 | Orvek .................................. 430/328 |
| 4,830,922 | 5/1989 | Sparrowhawk et al. ........... 428/411.1 |
| 4,902,769 | * 2/1990 | Cassidy et al. ...................... 528/125 |
| 4,920,639 | 5/1990 | Yee ..................................... 29/846 |
| 4,991,286 | 2/1991 | Russo et al. ......................... 29/840 |
| 5,274,913 | * 1/1994 | Grebe et al. ......................... 29/840 |
| 5,381,304 | 1/1995 | Theroux et al. ..................... 361/706 |
| 5,405,807 | * 4/1995 | Baker et al. ......................... 437/205 |
| 5,434,751 | * 7/1995 | Cole, Jr. et al. ..................... 361/792 |
| 5,512,613 | 4/1996 | Afzali-Ardakani et al. ......... 523/443 |
| 5,560,934 | 10/1996 | Afzali-Ardakani et al. ......... 424/497 |
| 5,600,181 | 2/1997 | Scott et al. .......................... 257/723 |
| 5,641,546 | 6/1997 | Elwell et al. ........................ 427/575 |
| 5,685,071 | 11/1997 | Gates, Jr. et al. .................... 29/840 |
| 5,828,126 | * 10/1998 | Thomas ............................... 257/695 |
| 5,858,943 | * 1/1999 | Buchwalter et al. ................ 510/204 |
| 6,111,323 | * 8/2000 | Carter et al. ........................ 257/787 |

OTHER PUBLICATIONS

"Cleavable Epoxy Resins: Design for Disassembly of a Thermoset," *Journal of Polymer Science*, Stephen L. Buchwalter and Laura L Kosbar, vol. 11, (1996).

"Reworkable Globtop Encapsulation," IBM AS/400 Division, John Stephanie and Joseph Kuczynski, pp. 364–379.

* cited by examiner

*Primary Examiner*—Matthew Smith
*Assistant Examiner*—Craig P. Lytle
(74) *Attorney, Agent, or Firm*—Fulbright & Jaworski L.L.P.

(57) ABSTRACT

The present invention provides an improved fluorinated polymer encapsulant for protectively coating electronic devices in an electronic device module. Also provided is a method for applying and reworkably removing the same to and from the electronic device module. In one embodiment, a coating of a fluorinated polymer solution is applied to at least a portion of an electronic device module. The module is then baked to operably fix to it the fluorinated polymer coating.

15 Claims, 5 Drawing Sheets

METHOD OF REWORKABLY REMOVING A FLUORINATED POLYMER ENCAPSULANT

This specification relies upon and hereby incorporates by reference provisional application No. 60/131,617 entitled "Reworkable Conformal Coating Methods" filed Apr. 28, 1999.

1. TECHNICAL FIELD

The present invention relates to protective coatings for electronic devices and, in particular, to a protective fluorinated polymer coating.

2. BACKGROUND

Protective device encapsulants, e.g., conformal coatings were originally developed to protect sensitive electronic assemblies from the harsh environments experienced in military, aerospace and marine domains. However, as the level of integration has increased in the electronic industry, e.g., with SMT and finer lead pitches associated with VLSI circuitry, the use of and need for adequate protective coatings has spread into a variety of commercial (as well as military) applications.

The continuing miniaturization of electronic systems has resulted in the integration of direct-chip-attach (or DCA) and chip-scale-package (or CSP) technologies. These technologies allow for the miniaturization of electronic systems by means of eliminating large chip packages. However, improved protective coatings and associated application and/or removal techniques are needed to provide such modules with the reliability and field performance of packaged ICs.

The ideal encapsulant should have properties that allow for easy application and removal, low cure temperature, temperature resistance, humidity resistance, and long pot-life. Of the presently used materials (e.g., acrylics, polyurethanes, epoxies, silicones, polyimides, and polyparaxylylene) none exhibits all of the ideal properties for a suitable encapsulant. The tradeoff is typically between the ease of application and processing on the one hand versus protective capability and environmental stability on the other hand. For example, acrylics are generally easy to apply and remove but typically exhibit low temperature and humidity resistance. Conversely, polyimides, generally have high temperature and humidity resistance but are difficult to apply, require a high cure temperature, and have short pot life. Another example is a material known as RTV, which has been used to coat chip-on-board systems. Unfortunately, however, RTV is reactive and cannot be directly applied without extensive board preparation. Epoxy coatings may be applied as glob-top encapsulants, but because epoxy has a significantly different thermal expansion coefficient than most printed circuit board materials, the curing process and environmental thermal cycling can result in unacceptable mechanical stress and failure at the component or board level. In addition, epoxies are not generally acceptably reovable for rework. Polyurethane has also been used for such coatings, but is unstable under high temperature and humidity. Significantly, most of these currently employed coatings are difficult to remove, making repair problematic and, in some cases, practically impossible.

Accordingly, what is needed is an improved encapsulant for protectively coating an electronic device. Moreover, what is needed is a solution for reworkably encapsulating an electronic device module.

3. SUMMARY OF THE INVENTION

The present invention provides an improved fluorinated polymer encapsulant for protectively coating electronic devices in an electronic device module. Also provided is a method for applying and reworkably removing the same to and from the electronic device module. In one embodiment, a coating of a fluorinated polymer solution is applied to at least a portion of an electronic device module. The module is then baked to operably fix to it the fluorinated polymer coating.

In another embodiment of the present invention, a method for reworkably removing a fixed fluorinated polymer coating from an electronic device module is provided. The method includes the acts of dissolving the fluorinated polymer with a solvent and sufficiently removing the dissolved fluorinated polymer coating from the module in order to rework it.

4. BRIEF DESCRIPTION OF THE DRAWINGS

FIG. 1A schematically depicts an electronic device module without any coating.

5. DETAILED DESCRIPTION

The present invention provides a protective encapsulant and a method for applying and reworkably removing the same for an electronic device module.

a. First Embodiment

Figure 1A:
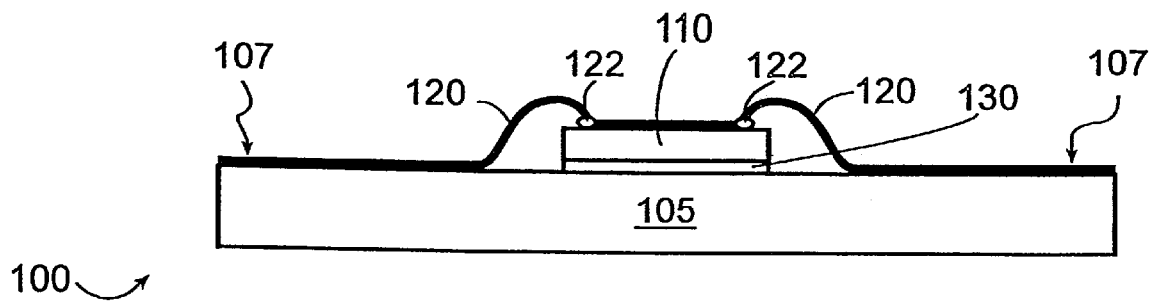
FIG. 1B shows the module of FIG. 1A with a coating of fluorinated polymer solution.
FIG. 1C shows the module of FIGS. 1A and 1B with a fixed fluorinated polymer coating.
Figure 1B:
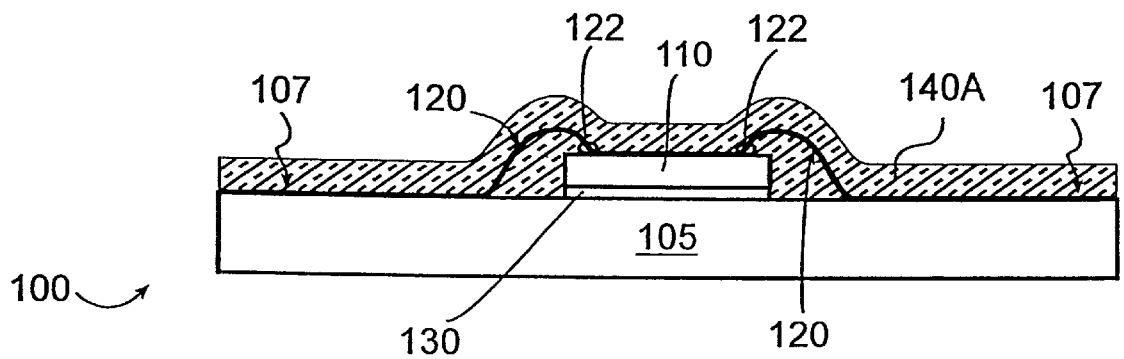
Figure 1C:
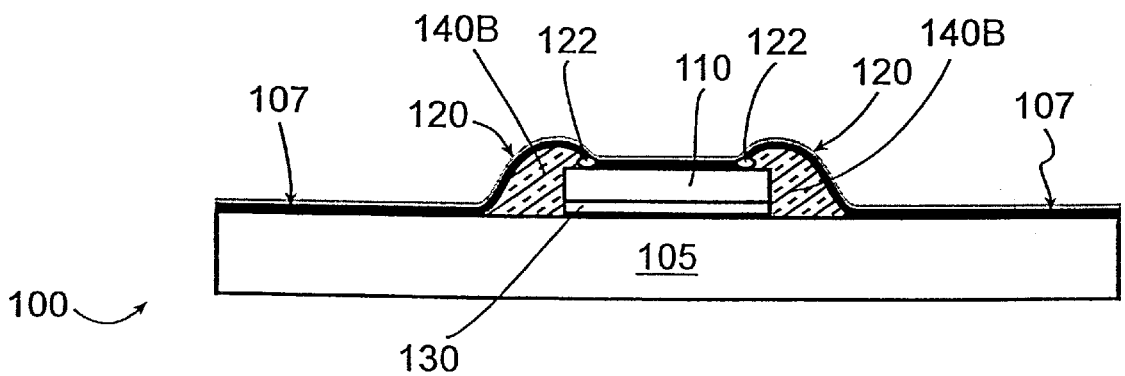

FIGS. 1A, 1B, and 1C schematically depict various stages of encapsulating one embodiment of an electronic device module 100 with the present invention. Conversely, FIGS. 2A, 2B, and 2C show various stages of removing the coating from the module in order to rework it.

Electronic device module 100 includes electronic devices such as bare integrated circuit chips 110 operably mounted to a printed circuit board ("PCB") 105 through adhesive 130. The electronic devices 110 are electrically connected to the PCB 105 through conductors 120. In the depicted embodiment, conductors 120 are wire bonded at one end 122 to the electronic device 110 and at the other end to the PCB metallization 107. FIG. 1A shows electronic device module 100 prior to being coated with a fluorinated polymer of the present invention. FIG. 1B shows the module 100 after fluorinated polymer solution 140A has been applied. At this point, the coating is "wet" and not yet fixed to the module.

Finally, FIG. 1C shows module 100 with the fixed (dry) fluorinated polymer coating 140B. (Note that reference 140A connotes the fluorinated polymer coating in a wet state, and 140B identifies the coating in a fixed, dry state.)

Figure 2A:
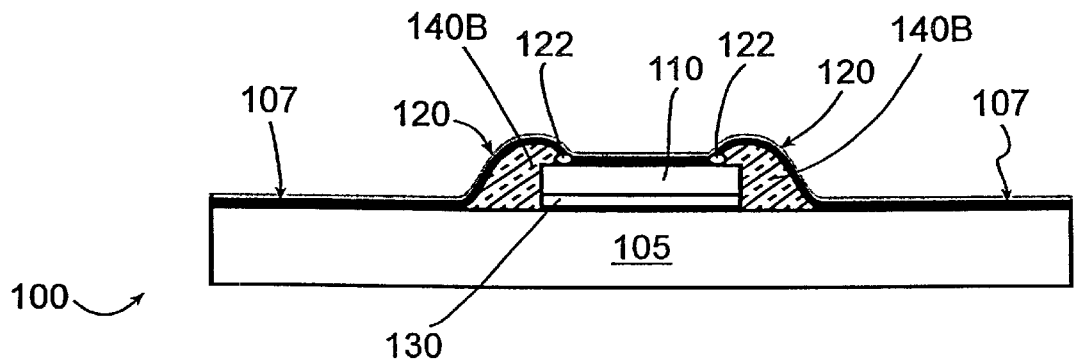
FIG. 2A shows an electronic device module prior to being reworked with its fixed coating in tact.
Figure 2B:
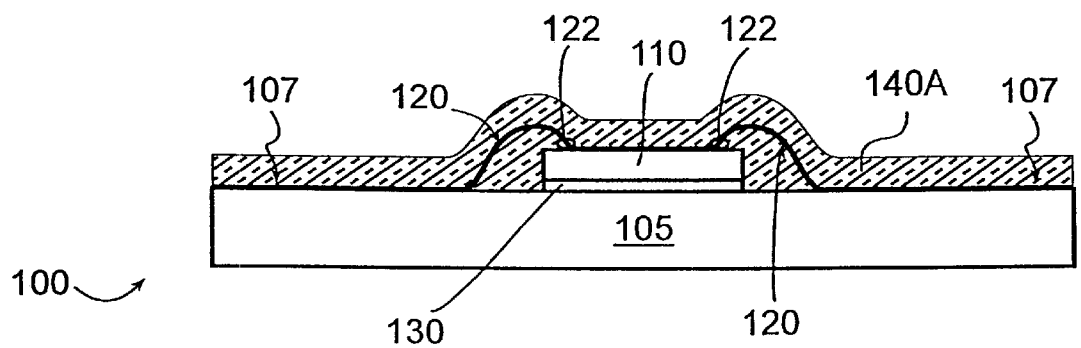
FIG. 2B shows the module of FIG. 2A with the fluorinated polymer coating in a "wet" and at least partially dissolved state.
Figure 2C:
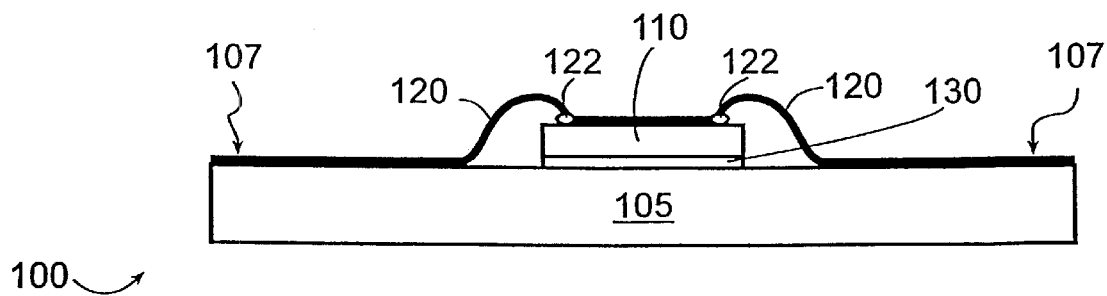
FIG. 2C shows the module of FIGS. 2A and 2B after the fluorinated polymer coating has been removed.

FIG. 2A shows module 100 with a fixed fluorinated polymer coating 140B; FIG. 2B shows the module 100 having a wet coating 140A as it is being dissolved for removal; and FIG. 2C shows the module 100 with the coating removed and the module ready to be reworked.

Electronic device module 100 and in turn, electronic devices 110 may comprise any electronic components, assemblies, or other peripheral materials, which require or benefit from the environmentally-protective coating of the present invention. Such devices could include but are not limited to bare chips, flip-chips, opto-electronic devices, and micro-electro-mechanical system (MEMS) devices. Moreover, an electronic device module may comprise any combination of devices such as a multi-chip module (MCM), multi-chip package (MCP), ball grid array ("BGA") package, plastic encapsulated microcircuit (PEM), a single chip package (SCP), and even flexible substrate materials. However, the coating methods of the present invention are particularly wsell-suited for direct chip attach ("DCA") and other reworkable applications.

Within the context of the present invention, a "fluorinated polymer" can include any suitable hexafluoroisopropylidene ("HFIP")-containing polymer (including both thermosets and thermoplastics) that provides a suitably protective coating for an electronic device module with the methods of the present invention. (Incorporation of the HFIP into a polymer backbone generally improves a number of its properties, including: increased thermal stability, increased environmental resistance, increased oxidative resistance, increased flame resistance, decreased dielectric constant, and lowered glass transition temperature.) One such fluorinated polymer is 12F-PEK fluorinated ploy(phenylene ether ketone), which is disclosed in U.S. Pat. No. 4,902,769 to Cassidy et al. and is hereby incorporated by reference into this specification.

Fluorinated polymers such as thermoplastic polymers bearing the HFIP group are generally soluble in common organic solvents such as xylene. The use of a solvent to form a fluorinated polymer solution generally improves and makes easier application of the fluorinated polymer onto an electronic device module 100. In one embodiment, a 5 to 10 per cent solution of 12F-PEK fluorinated polymer in solvent (e.g., xylene) with an inherent viscosity above 0.3 is used. In a more particular embodiment, a solution of 6.4% 12F-PEK in xylene with an inherent viscosity of about 0.8 is used. This consistency is well-suited for applying (e.g., spraying) the fluorinated polymer onto the electronic device module 100.

b. Coating Application

With reference to FIGS. 1A through 1C, a process for applying a fluorinated polymer coating to device module 100 will be described.

In general, the fluorinated polymer solution is initially applied to the device module 100. It may be applied in a variety of ways including extrusion, spray coat, brush coat, spin coat, or any other suitable application method. For example, it may be sprayed using a conventional sprayer such as a Preval™ sprayer available from Sherwin Williams Mfg. and Precision Valve Corp. of Yonkers, N.Y. After the coating has been adequately applied, the module 100 with a wet fluorinated polymer coat 140A is fixed through baking.

In one embodiment, a first coating of fluorinated polymer solution is applied via spraying to device module 100. FIG. 1B shows module 100 after a "wet" coating 140A has been applied. The module 100 is then baked (or prebaked) within a temperature range of 90° C. to 120° C. for a time ranging between 30 and 60 minutes to drive off the solvents (e.g., xylene). A second coating is then applied to the module 100 Again, the module 100 is prebaked within a range of 90° C. to 120° C. for from 30 to 60 minutes to drive off solvents from the second coating. Finally, module 100 is subjected to a fixed baking. In one preferred embodiment, its temperature is ramped to a baking temperature within a range of between 180° C. to 220° C. The module is baked within this range for a time of between 60 to 120 minutes. The temperature is preferably ramped from the prebake to the fixing bake at 5° C. to 10° C. per minute. A cool down next follows, which preferably is done at natural rates (e.g., leaving the module within the oven after it has been turned off). FIG. 1C shows module 100 coated with a fixed (dry) coating 140B of the fluorinated polymer.

In one more particular, embodiment, a first coating is spray applied onto module 100. This is followed by a prebake within a range of 100° C. to 120° C. for from 45 to 60 minutes. A second coating is applied followed by a prebake at a range of between 100° C. to 120° C. followed by a thermal ramp to a range of between 200° C. to 220° C. held for from 90 to 120 minutes.

In another more particular embodiment, a first coating is spray applied. This is followed by a prebake within a range of 110° C. to 120° C. for from 50 to 60 minutes for driving off solvent. This is then followed with a second applied coating and prebake at a range of from 110° C. to 120° C. for from 50 to 60 minutes. Finally, the module 100 is ramped to a temperature within a range of 210° C. to 220° C. and held there for from 105 to 120 minutes to fix the coating. The module is then cooled to room temperature within the baking oven.

In a further embodiment of this concept, the fluorinated polymer would be "filled" with microscopic (1–10 microns) particles of inorganic material (i.e. silica or alumina) to modify, especially lower, the coefficient of thermal expansion (or CTE) of the fluoropolymer matrix. By modifying the coefficient of thermal expansion of an organic polymer material, the CTE of the polymer material can be closely matched to that of the electronic components and/or substrate material therefore leading to increased reliability of the assembly.

c. Coating Removal

Reworkability of the module 100 is provided through the removal of the coating 140B. FIG. 2A shows module 100 prior to having its coating 140B removed. A fluorinated polymer coating may generally be removed by dissolving the fluorinated polymer coating with a solvent (e.g., organic solvent) and sufficiently removing the dissolved fluorinated polymer coating from the module in order to appropriately rework it.

Any suitable solvent that is not reactive with the module 100 may be used. Such a solvent could include but is not limited to xylene, chloroform, tetrahydrofuran, dimethylacetamide, and N-methylpyrrolidone, and acetate-based solvents. The solvent used to apply the fluorinated polymer will normally suffice. In one embodiment, xylene, which may also be used in the fluorinated polymer solution, is used to dissolve the fixed coating in order to remove it. Moreover, the coating 140B may be dissolved by applying the solvent in any suitable manner. For example, in one embodiment, the entire module 100 is immersed and soaked in a solvent (e.g., xylene) bath. FIG. 2B shows module 100 with a "wet" dissolved coating 140A.

After the fluorinated polymer coating is sufficiently dissolved, it can be removed from the module 100. The dissolved coating may be removed by any suitable means including rinsing, blowing, or scraping. In one embodiment, the dissolved fluorinated polymer is removed by rinsing the module with a solvent rinse, which may be any suitable material for rinsably removing the dissolved fluorinated polymer coating. Preferably, this rinse is relatively volatile and reasonably capable of dissolving the solvent. Such a rinse could include but is not limited to xylene, isopropanol and acetone. After the dissolved coating has been removed, the module may then be dried, e.g., at atmospheric conditions or with compressed nitrogen. FIG. 2C shows module 100 after the fluorinated polymer coating has been removed. At this stage the module is ready to be reworked. For example, the active and/or passive electronic components (e.g., wire bond ICs, flip chip ICs, or SMT components) would be removed along with their respective inter connects. The electronic components could then be replaced with interconnections from the electronic components to the module or substrate.

d. Other Embodiments

It will be seen by those skilled in the art that various changes may be made without departing from the spirit and scope of the invention. For example, the fluorinated polymer coating is effective with both silicon and gallium arsenide semiconductor devices. In addition, while the invention has primarily been described with the use of two coats of fluorinated polymer, any number including one or more coats may be used. Moreover, the fluoropolymer encapsulant of the present invention can be applied at the board, package, or even wafer level. For example, it can be applied to a wafer of ICs after fabrication. After applying the coating, an interconnect metallization layer could be fabricated and redistributed from IC connecting pads to the substrate connecting pads. With such an encapsulating process, wafer level chip-scale-packages with excellent resistance to both heat and humidity can be manufactured.

Furthermore, while the invention has primarily been described as a coating for COB modules, it may be used with various other electronic devices and electronic device modules.

Figure 3:
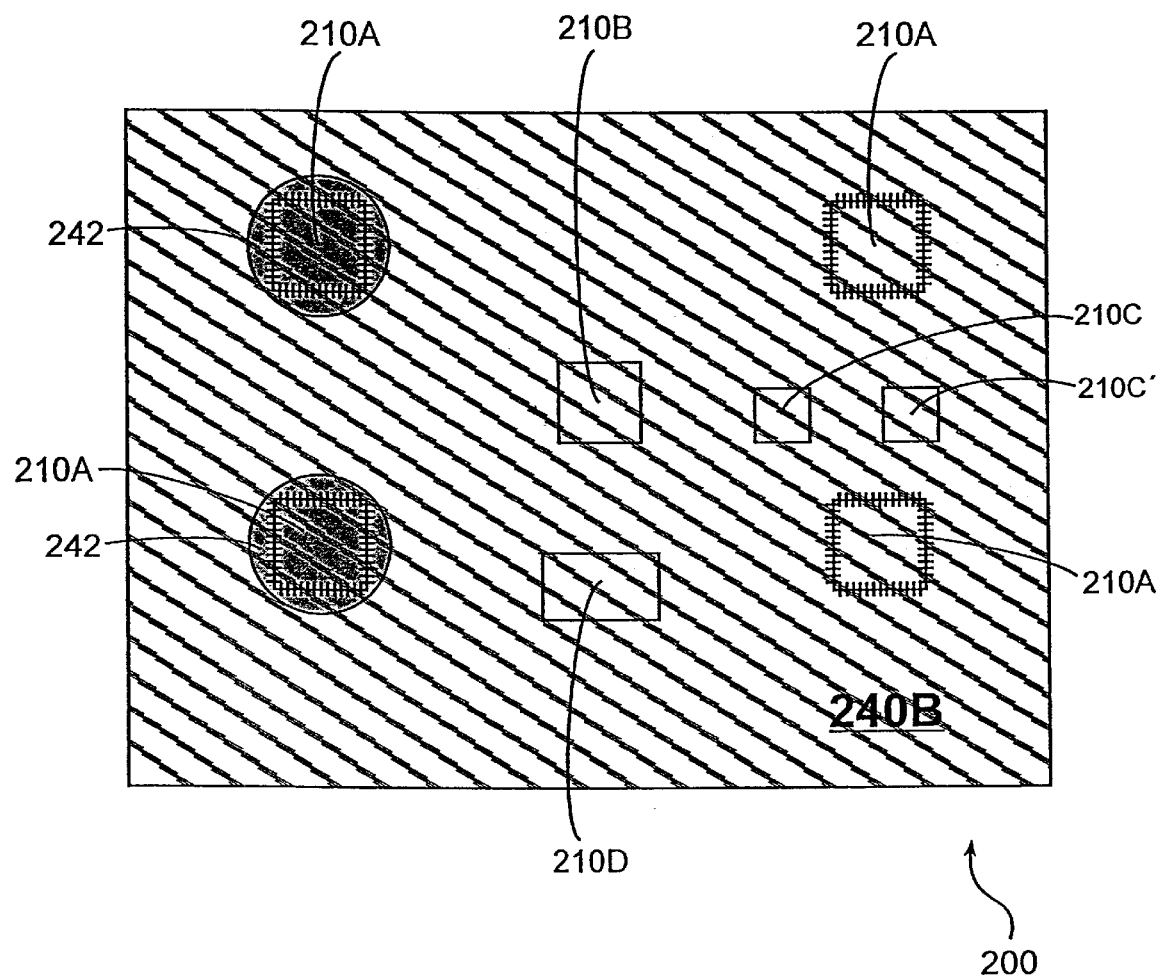
FIG. 3 shows a top view of a different electronic device module.
Figure 4:
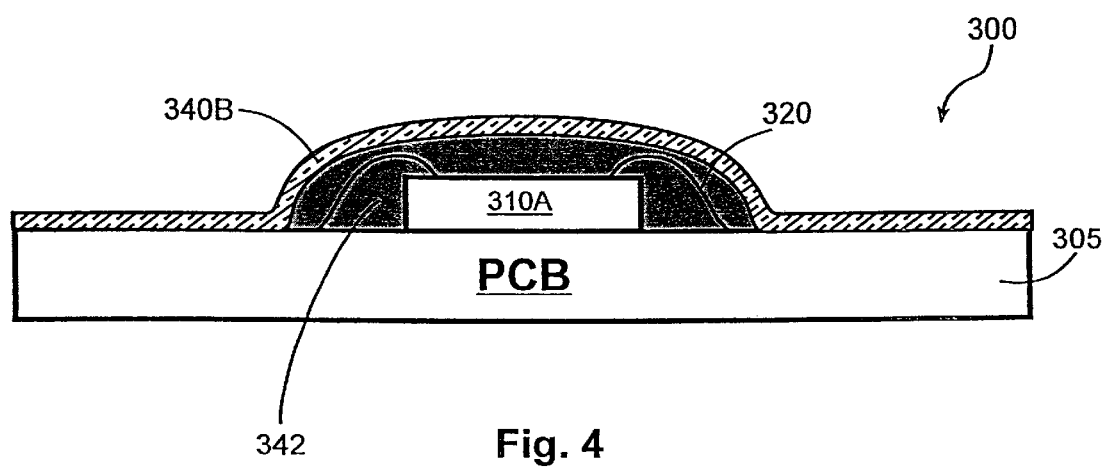
FIG. 4 shows a sectional view of an electronic device module with a device that has a pre-existing epoxy undercoat that is encapsulated with the present invention.

FIG. 3 shows a top view of an electronic device module 200. This module illustrates just some of the many ways the fluorinated polymer coating of the present invention may be used to protect electronic devices. Module 200 includes wire-bonded chips 210A, flip-chips 210B, opto-electronic devices 210C, and MEMS devices 210D. Other devices that may be used include SMT components (i.e. decoupling capacitors). Some of the wire-bonded chips 210A are encapsulated with a conventional epoxy coating 242. The entire (at least top surface) of the module 200 is encapsulated with a fluorinated polymer coating 240B. With this embodiment, not only does the fluorinated coating 240B protect the non-coated devices (e.g., 210B), but also, it benefits the devices (210A) that are coated with the conventional epoxy coating because it has a generally better resistance to humidity. FIG. 4 shows a sectional view of a module 300 with a device 310A that has a pre-existing epoxy overcoat or coating. Module 300 includes wire-bonded device 310A mounted to PCB 305 via wire-bond conductors 320. Device 310A has been originally coated with an epoxy encapsulant 342. For improved protection from water absorption and/or penetration, a coat of fluorinated polymer 340B is applied to encapsulate the epoxy coat 342.

Figure 5:
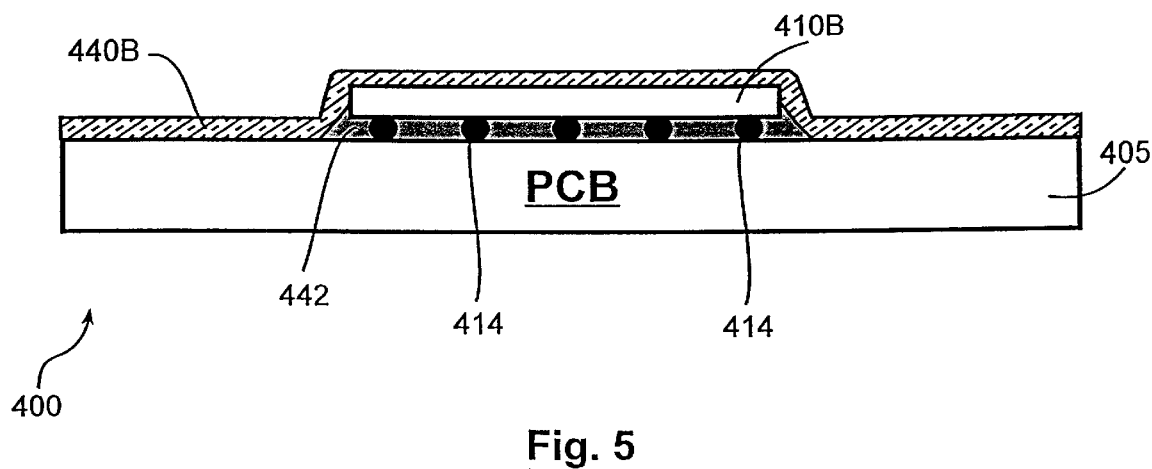
FIG. 5 shows an electronic device module with a flip-chip device that is encapsulated with the present invention.

FIG. 5 shows an electronic device module 400 with a flip-chip device. Module 400 includes flip-chip 410B electrically connected to PCB 405 through metal contact balls (or bumps) 414. In the depicted embodiment, a conventional material (e.g., epoxy) is used as an underfill 442, and fluorinated polymer 440B is used to encapsulate the device 410B within module 400. However, fluorinated polymer could also be used as the underfill.

Figure 6:
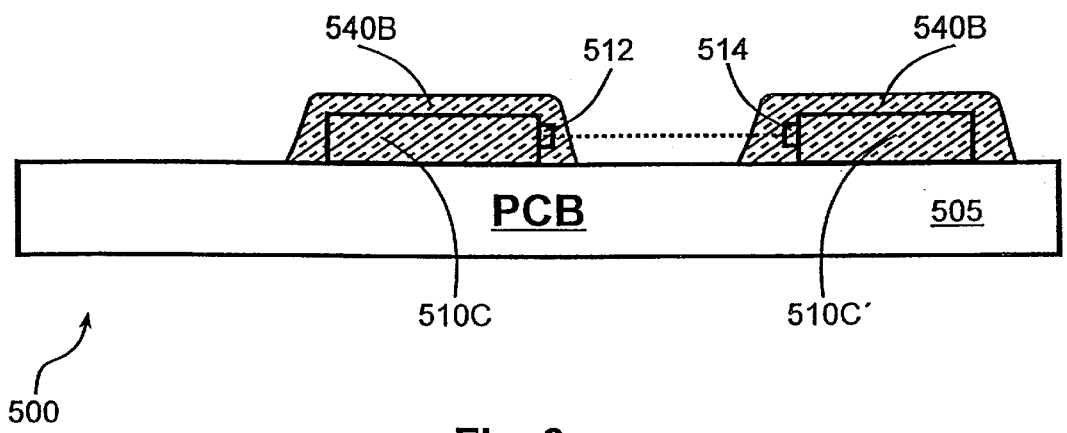
FIG. 6 shows an electronic device module 500 with cooperating opto-electronic devices encapsulated with a fluorinated polymer coating.

FIG. 6 shows an electronic device module 500 with cooperating opto-electronic devices 510C and 510C' mounted to substrate 505. Device 510C includes emitter 512 (e.g. vertical cavity surface emitting lasers or VC SEC) for photonically communicating or linking it with device 510C' through receiver or detector 514. FIG. 6 depicts horizontal communication between devices 510C and 510C', however, the communication between device 510C and 510C' may be vertical in nature. Each device is coated or encapsulated with flouropolymer 540B to provide environmental protection. Because of its translucent nature (or optical clarity), fluorinated polymer 540B is ideally suited for protectively encapsulating opto-electronic devices.

In this embodiment, opto-electric communication is depicted to occur between opto-electric devices 510C and 510C' which exist on the same module or substrate. A further embodiment includes opto-electronic communication between opto-electronic devices on separate modules (module to module communication).

Figure 7:
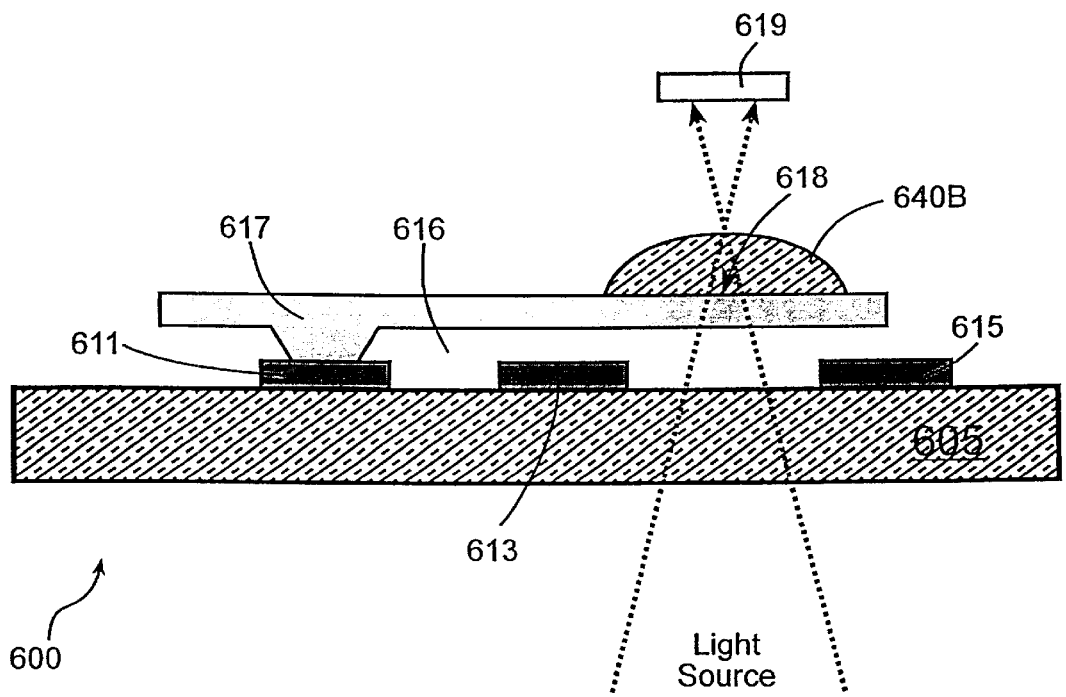
FIG. 7 shows an electronic device module with a micro opto electro mechanical system having a lens that is encapsulated with a fluorinated polymer.

FIG. 7 shows an electronic device module 600 with a micro opto electro mechanical actuator system that incorporates a fluorinated polymer encapsulant of the present invention. The system includes a metallic source 611, metallic gate 613, and a metallic drain 615 mounted atop a transparent substrate 605. An overhang beam 617 is mounted at one end to the metallic source 611. The overhanging beam 617 in connection with substrate 605, source 611, gate 613, and drain 615 define a gap region that is created from a removed sacrificial layer. Beam 617 includes an opening (not shown) 618 in alignment with an underlying light source. A lens 640B is mounted to beam 617 in alignment with opening 618. The lens 640B is composed of a fluorinated polymer of the present invention. In one embodiment, the lens is spin-coated and defined until it has an acceptable convexity. The system also includes a detector 619 for receiving light from the light source through lens 640B. The fluorinated polymer, with its translucent nature and resistance to heat and humidity, works well as a lens material. In another embodiment, a conventional lens coated with a fluorinated polymer could also be used. In yet another embodiment, a fluorinated polymer is also used as the sacrificial layer during device fabrication. It is well-suited for this purpose because it may be easily removed with a suitable solvent and it can withstand the high temperatures that are associated with device fabrication (e.g. sputter deposition).

Accordingly, the invention, as defined in the claims, is not limited to what is expressly described in the specification and drawings.

e. Remarks

The present invention provides a method for coating electronic components with a high temperature stable and readily applicable protective encapsulant. It provides simple coating application and removal of corrosion resistant, substantially hermetic encapsulation for rework of the coated module. the fluorinated polymer encapsulant of the present invention is an improvement over conventional coatings such as silicon nitride. Among other things, it provides long term environmental resistance, thermal stability, and optical clarity even in harsh environments.

I claim as follows:

1. A method for reworkably removing fixed fluorinated polymer coating from an electronic device module, the method comprising:

(a) dissolving the fluorinated polymer with a solvent; and (b) sufficiently removing the dissolved fluorinated polymer coating from the module in order to rework it, wherein substantially no chemical reaction occurs between said fluorinated polymer and said solvent when said fluorinated polymer is dissolved with said solvent.

2. The method of claim 1, farther comprising the act of drying the module.

3. The method of claim 2, wherein the act of drying includes drying the module with compressed nitrogen gas.

4. The method of claim 1, wherein the dissolved fluorinated polymer is removed by rinsing the module with a solvent rinse.

5. The method of claim 4, wherein the act of rinsing includes rinsing with isopropanol.

6. The method of claim 1, wherein the act of dissolving the fluorinated polymer includes immersing the coated device in the solvent.

7. The method of claim 6, wherein the act of dissolving the fluorinated polymer includes dissolving the fluorinated polymer in xylene.

8. A method for reworkably removing fixed fluorinated polymer coating from an electronic device module, the method comprising:

(a) dissolving the fluorinated polymer with a solvent that will not adversely react with said electronic device module; and (b) sufficiently removing the dissolved fluorinated polymer coating from the module in order to rework it.

9. The method of claim 8, further comprising the act of drying the module.

10. The method of claim 9, wherein the act of drying includes drying the module with compressed nitrogen gas.

11. The method of claim 8, wherein the dissolved fluorinated polymer is removed by rinsing the module with a solvent rinse.

12. The method of claim 11, wherein the act of rinsing includes rinsing with isopropanol.

13. The method of claim 8, wherein the act of dissolving the fluorinated polymer includes immersing the coated device in the solvent.

14. The method of claim 13, wherein the act of dissolving the fluorinated polymer includes dissolving the fluorinated polymer in xylene.

15. A method for reworkably removing fixed fluorinated polymer coating from an electronic device module, the method comprising:

(a) dissolving the fluorinated polymer with a solvent; and (b) sufficiently removing the dissolved fluorinated polymer coating from the module in order to rework it, wherein said solvent does not break crosslinks in said fixed fluorinated polymer coating.

\* \* \* \* \*